United States Patent
Kwak et al.

(10) Patent No.: US 7,285,857 B2
(45) Date of Patent: Oct. 23, 2007

(54) GAN-BASED III—V GROUP COMPOUND SEMICONDUCTOR DEVICE AND P-TYPE ELECTRODE FOR THE SAME

(75) Inventors: Joon-seop Kwak, Gyeonggi-do (KR); Tae-yeon Seong, Gwangju-si (KR); Ok-hyun Nam, Seoul (KR); June-o Song, Gwangju-si (KR); Dong-seok Leem, Gwangju-si (KR)

(73) Assignees: Samsung Electronics Co., Ltd., Suwon-si, Gyeonggi-do (KR); Gwangju Institute of Science and Technology, Buk-gu, Gwangju-si (KR)

( * ) Notice: Subject to any disclaimer, the term of this patent is extended or adjusted under 35 U.S.C. 154(b) by 0 days.

(21) Appl. No.: 10/953,282

(22) Filed: Sep. 30, 2004

(65) Prior Publication Data

US 2005/0087758 A1    Apr. 28, 2005

(30) Foreign Application Priority Data

Oct. 27, 2003    (KR) ............... 10-2003-0075219

(51) Int. Cl.
*H01L 29/45* (2006.01)
*H01L 33/00* (2006.01)

(52) U.S. Cl. ............... 257/745; 257/E29.144; 257/E33.063; 257/99

(58) Field of Classification Search ........ 257/E33.064, 257/E29.143–E29.145, 99, E33.063, 745; 438/604–606
See application file for complete search history.

(56) References Cited

U.S. PATENT DOCUMENTS

| | | |
|---|---|---|
| 5,760,423 A | 6/1998 | Kamakura et al. |
| 5,877,558 A | 3/1999 | Nakamura et al. |
| 6,008,539 A | 12/1999 | Shibata et al. |
| 6,185,238 B1 * | 2/2001 | Onomura et al. ........ 372/46.01 |
| 6,326,223 B1 * | 12/2001 | Miki et al. ................ 438/22 |
| 6,365,969 B1 * | 4/2002 | Yamaguchi et al. ........ 257/745 |
| 6,388,323 B1 | 5/2002 | Iyechika et al. |
| 6,825,502 B2 * | 11/2004 | Okazaki et al. ............ 257/98 |

(Continued)

FOREIGN PATENT DOCUMENTS

EP    1168460 A2    1/2002

(Continued)

OTHER PUBLICATIONS

Korean Search Report.

(Continued)

*Primary Examiner*—Matthew C. Landau
(74) *Attorney, Agent, or Firm*—Buchanan Ingersoll & Rooney PC

(57) ABSTRACT

Provided are a p-type electrode and a III-V group GaN-based compound semiconductor device using the same. The electrode includes a first layer disposed on a III-V group nitride compound semiconductor layer and formed of a Zn-based material containing a solute; and a second layer stacked on the first layer and formed of at least one selected from the group consisting of Au, Co, Pd, Pt, Ru, Rh, Ir, Ta, Cr, Mn, Mo, Tc, W, Re, Fe, Sc, Ti, Sn, Ge, Sb, Al, ITO, and ZnO. The Zn-based p-type electrode has excellent electrical, optical, and thermal properties.

22 Claims, 6 Drawing Sheets

U.S. PATENT DOCUMENTS

2003/0197184 A1* 10/2003 Kaneko ........................ 257/79

FOREIGN PATENT DOCUMENTS

| EP | 1475845 A1 | 11/2004 |
| EP | 1511091 A2 | 3/2005 |
| JP | 10-190055 | 7/1998 |
| JP | 10-270758 | 10/1998 |
| JP | 2000-036619 | 2/2000 |

OTHER PUBLICATIONS

Korean Office Action dated Apr. 6, 2006 and English translation thereof.
European Search Report dated Sep. 14, 2006.
Office Action issued by the Chinese Patent Office dated Apr. 27, 2007 and English translation.

* cited by examiner

GAN-BASED III—V GROUP COMPOUND SEMICONDUCTOR DEVICE AND P-TYPE ELECTRODE FOR THE SAME

This application claims the priority of Korean Patent Application No. 2003-75219, filed on Oct. 27, 2003, in the Korean Intellectual Property Office, the disclosure of which is incorporated herein in its entirety by reference.

BACKGROUND OF THE INVENTION

1. Field of the Invention

The present invention relates to a GaN-based III-V group compound semiconductor device and a p-type electrode for the same.

2. Description of the Related Art

To embody an optical device, such as a light emitting diode (LED) or a laser diode (LD), using GaN-based compound semiconductor, it is very important to form a high-quality ohmic contact between a semiconductor layer and an electrode. An ohmic contact layer for a p-type GaN semiconductor layer may be a Ni-based metal thin layer, i.e., a transparent metal thin layer formed of Ni and Au (refer to U.S. Pat. Nos. 5,877,558 and 6,008,539).

As is known, when a Ni-based thin layer is annealed in an $O_2$ atmosphere, an ohmic contact having a low specific contact resistance of about $10^{-3}$ to $10^{-4}$ $\Omega cm^2$ is formed. When the N-based thin layer is annealed in the $O_2$ atmosphere at a temperature of about 500 to 600° C., due to the low specific contact resistance, nickel oxide (NiO), which is a p-type semiconductor oxide, is formed between an island-shaped Au layers and on the Au layers at an interface between a GaN layer and a Ni layer, thereby reducing a Schottky barrier height (HBT). Thus, as the HBT is reduced, majority carriers, i.e., holes are easily supplied near to the surface of the GaN layer so that effective carrier concentration can increase near the surface of the GaN layer. Meanwhile, when a Ni/Au layer is brought into contact with a p-type GaN semiconductor layer and is annealed, an intermetal complex between Mg and H is removed. This leads to reactivation, which increases a Mg-waveguident concentration in the surface of the p-type GaN semiconductor layer. As a result, the effective carrier concentration is raised to $10^{19}/cm^3$ or higher to cause a tunneling phenomenon between the p-type GaN semiconductor layer and an electrode layer (i.e., the NiO layer), thereby exhibiting an ohmic conducting characteristic. However, since the Ni/Au thin layer is not appropriate for an LD that requires a lower ohmic contact resistance, a new ohmic contact material having a sufficiently low specific contact resistance is needed.

SUMMARY OF THE INVENTION

The present invention provides an ohmic contact metal system, which has excellent electrical, optical, and thermal characteristics with respect to a GaN-based semiconductor layer.

More specifically, to apply GaN-based semiconductor to optical devices, embodiments of the present invention provide an ohmic contact metal system of an electrode formed of a transparent thin layer having good electrical, optical, and thermal characteristics, which are requisite for the manufacturing of a metal electrode using p-type GaN-based semiconductor.

According to an aspect of the present invention, there is provided an electrode for a III-V group GaN-based compound semiconductor device. The electrode includes a first layer disposed on a III-V group nitride compound semiconductor layer and formed of a Zn-based material containing a solute; and a second layer stacked on the first layer and formed of at least one selected from the group consisting of Au, Co, Pd, Pt, Ru, Rh, Ir, Ta, Cr, Mn, Mo, Tc, W, Re, Fe, Sc, Ti, Sn, Ge, Sb, Al, ITO, ZITO, ZIO, GIO, ZTO, FTO, AZO, GZO, $In_4Sn_3O_{12}$, and $Zn_{1-x}Mg_xO (0 \leq x \leq 1)$.

The Zn-based material constituting the first layer may be one of an alloy and a solid solution.

The Zn-based material may contain at least a solute selected from the group consisting of Ni, Mg, Co, Pd, Pt, Ru, Rh, Ir, Ta, Cr, Mn, Mo, Tc, W, Re, Fe, Sc, Ti, Sn, Ge, Sb, and Ag.

The electrode may further comprise an intermediate layer interposed between the first layer and the second layer, and the intermediate layer may be formed of at least one selected from the group consisting of Co, Pd, Pt, Ru, Rh, Ir, Ta, Cr, Mn, Mo, Tc, W, Re, Fe, Sc, Ti, Sn, Ge, and Sb.

An amount of the solute contained in the Zn-based material may be in the range of about 0.1 to 49.9 atomic %. Each of the first layer and the second layer may have a thickness of about 0.1 to 100 nm.

According to another aspect of the present invention, there is provided a III-V group GaN-based compound semiconductor device, such as a laser diode (LD) or a light emitting diode (LED), which is formed of one of GaN and $Al_xIn_yGa_zN$ (0<x+y+z<1).

To form a high-quality ohmic contact of a p-type GaN-based semiconductor layer (hereinafter, a p-type semiconductor layer), the carrier concentration of the p-type semiconductor layer should be about $1 \times 10^{17}/cm^3$ or higher.

Also, to form the ohmic contact of the p-type semiconductor layer, a metal that reacts to Ga prior to N in the p-type semiconductor layer is used. Thus, Ga of the p-type semiconductor layer reacts to the metal, thus generating Ga vacancies in the surface of the p-type semiconductor layer. As the Ga vacancies function as a p-type dopant, an effective concentration of p-type carriers in the surface of p-type semiconductor layer increases. In addition, the III-V group GaN-based compound semiconductor device requires a metal material, which reduces a $Ga_2O_3$ layer, which is a native oxide layer that remains on the p-type semiconductor layer, to reduce a Schottky barrier. The $Ga_2O_3$ layer serves as a barrier to flow of carriers at an interface between an electrode material and the p-type semiconductor layer. In this case, a tunneling conduction phenomenon may occur at the interface between the electrode material and the p-type semiconductor layer.

In the present invention, a p-type electrode, which is formed by depositing a Zn-based alloy or a Zn-based solid solution, is formed of a metal material, which has an excellent oxidation activity to reduce a native oxide layer and functions as a p-type dopant in the p-type semiconductor layer to increase effective hole concentration near the surface of the p-type semiconductor layer. Also, since ZnO obtained by annealing in an air or $O_2$ atmosphere and oxide of a solute added to a Zn-based electrode material have almost the same work function as that of GaN, when they contact p-type GaN, a Schottky barrier height (HBT) can be reduced to improve an ohmic contact characteristic.

The uppermost electrode layer of the semiconductor device, such as an LD or an LED, should be formed of Au or Ag, which prevents surface degradation during a high-temperature (about 300 to 600° C.) semiconductor manufacturing process, resists oxidation, and has a good wire bonding characteristic and a high transparency.

In the present invention, the Zn-based electrode material is optically transparent.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
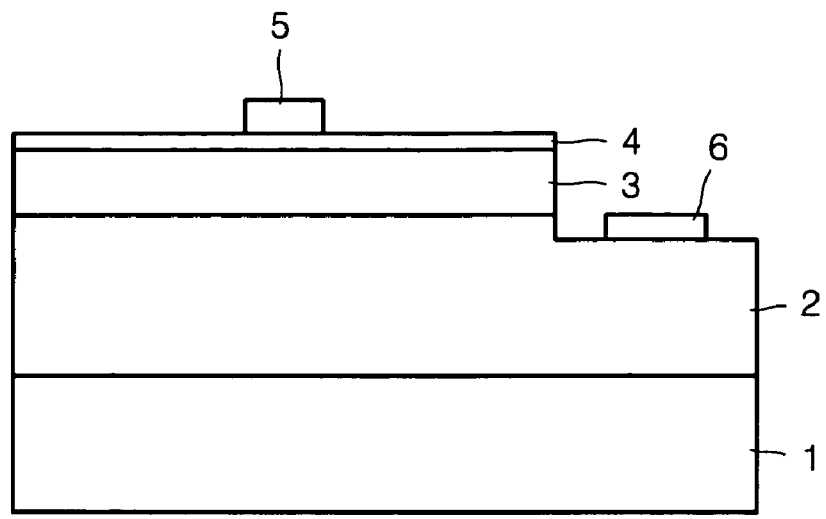
FIG. 1A is a schematic cross-sectional view of a GaN-based III-V group compound semiconductor light emitting diode (LED) according an embodiment of the present invention.

The present invention will now be described more fully with reference to the accompanying drawings, in which exemplary embodiments of the invention are shown. In the drawings, the thicknesses and sizes of layers and regions are exaggerated for clarity of explanation.

FIG. 1A is a schematic cross-sectional view of a GaN-based III-V group semiconductor light emitting diode (LED) according to an embodiment of the present invention.

An n-type III-V group nitride compound semiconductor stack layer 2 is formed on an insulating substrate, such as a sapphire substrate, and a p-type compound semiconductor stack layer 3 is formed thereon.

A p-type electrode 4 is formed on the p-type compound semiconductor stack layer 3. The p-type electrode 4 is a multiple layer including a Zn-based electrode layer. A bonding pad 5 for electrical connection is formed on the p-type electrode 4. The p-type electrode 4 will be described in detail later. According to another embodiment of the present invention, an LED may include a different stack structure than described above, but is characterized by including the p-type electrode 4 disposed on a p-type semiconductor layer.

Figure 1B:
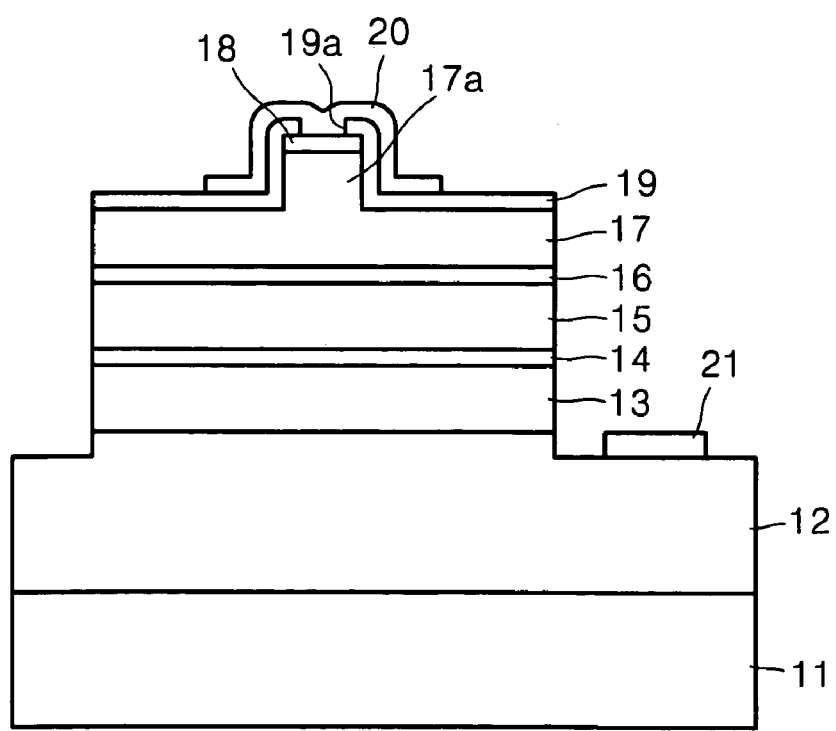
FIG. 1B is a schematic cross-sectional view of a GaN-based III-V group compound semiconductor laser diode (LD) according another embodiment of the present invention.

FIG. 1B is a schematic cross-sectional view of a GaN-based III-V group compound semiconductor laser diode (LD) according another embodiment of the present invention.

Referring to FIG. 1B, an n-GaN lower contact layer 12 is stacked on a sapphire substrate 11. A plurality of semiconductor layers are disposed on the lower contact layer 12 and form a mesa structure. That is, an n-GaN/AlGaN lower clad layer 13, n-GaN lower waveguide layer 14, an InGaN active layer 15, a p-GaN upper waveguide layer 16, and a p-GaN/AlGaN upper clad layer 17 are sequentially sacked on the n-GaN lower contact layer 12. Here, The n-GaN/AlGaN lower clad layer 13 and the p-GaN/AlGaN upper layer 17 have lower refractive indexes than the n-GaN lower waveguide layer 14 and the p-GaN upper waveguide layer 16, and the n-GaN lower waveguide layer 14 and the p-GaN upper waveguide layer 16 have lower refractive indexes than the InGaN active layer 15. In the mesa structure, a protruding ridge 17a having a predetermined width is formed in the center of a top surface of the p-GaN/AlGaN upper clad layer 17 to provide a ridge wave guide structure, and a p-GaN upper contact layer 18 is formed on top of the ridge 17a. A buried layer 19 is formed on the p-GaN upper contact layer 18. The buried layer 19 has a contact hole 19a and functions as a passivation layer. The contact hole 19a of the buried layer 19 corresponds to a top portion of the upper contact layer 18 formed on top of the ridge 17a, and an outer portion of the contact hole 19a overlaps an outer portion of a top surface of the upper contact layer 18.

A p-type electrode 20 is formed on the buried layer 19. The p-type electrode 20 is a multiple layer including a Zn-based material layer. The p-type electrode 20 contacts the upper contact layer 18 via the contact hole 19a formed in the buried layer 19. An n-type electrode 21 is formed in a stepped portion formed on one side of the lower contact layer 12. The ridge wave guide structure provided on the upper clad layer 17 limits a current applied to the active layer 15. Thus, the width of a resonance region is limited to stabilize a transverse mode characteristic and reduce an operating current.

To manufacture a typical N-based semiconductor laser device, a multiple GaN-based semiconductor layer is formed on a sapphire substrate, a ridge corresponding to a current application region is formed using dry etching, and a mesa structure is formed on an n-GaN lower contact layer to expose the n-GaN lower contact layer and form a resonance surface. This mesa structure is arrayed on a substrate, such as the sapphire substrate, and finally separated into unit devices using scribing.

Figure 2A:
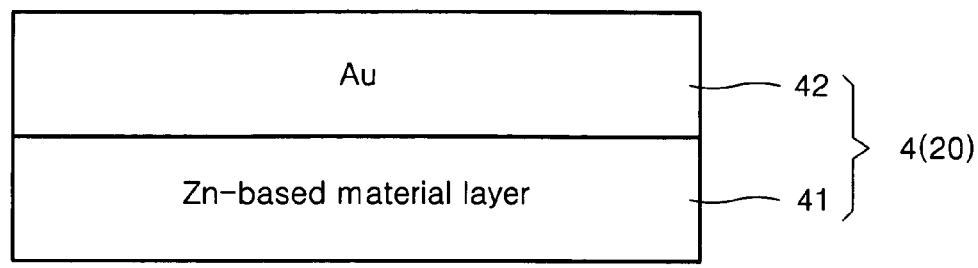
FIG. 2A is a schematic cross-sectional view of a p-type electrode of a GaN-based III-V group compound semiconductor device according to an embodiment of the present invention.
Figure 2B:
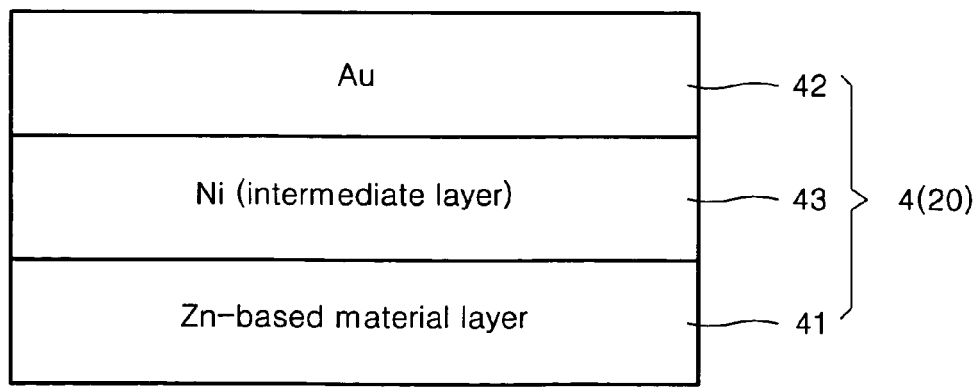
FIG. 2B is a schematic cross-sectional view of a p-type electrode of a GaN-based III-V group compound semiconductor device according to another embodiment of the present invention.

FIGS. 2A and 2B are schematic cross-sectional views of a p-type electrode of a GaN-based III-V group compound semiconductor device according to embodiments of the present invention.

Referring to FIG. 2A, each of the p-type electrodes 4 and 12 according to the present invention includes a first electrode layer 41 and a second electrode layer 42. The first electrode layer 41 is formed of a Zn-based material and contacts a III-V group GaN-based compound semiconductor layer. The second electrode layer 42 is disposed on the first electrode layer 41 and formed of, for example, a metal or a transparent oxide conductive material on which a bonding pad is formed.

The Zn-based material of which the first electrode layer 41 is formed is a Zn-based alloy or a Zn-based solid solution. The Zn-based material contains at least a solute selected from the group consisting of Ni, Mg, Co, Pd, Pt, Ru, Rh, Ir, Ta, Cr, Mn, Mo, Tc, W, Re, Fe, Sc, Ti, Sn, Ge, Sb, and Ag, for instance.

The second electrode layer 42 is a metal layer or a transparent conductive oxide (TCO) layer. Here, the metal layer may be formed of Au, Co, Pd, Pt, Ru, Rh, Ir, Ta, Cr, Mn, Mo, Tc, W, Re, Fe, Sc, Ti, Sn, Ge, Sb, Al. The TCO layer may be formed of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, or zinc magnesium oxide ($Zn_{1-x}Mg_xO$, $0 \leq x \leq 1$). The oxide layer may be, for example, a $Zn_2In_2O_5$ layer, a $GaInO_3$ layer, a $ZnSnO_3$ layer, an F-doped $SnO_2$ layer, an Al-doped ZnO layer, a Ga-doped ZnO layer, a MgO layer, or a ZnO layer.

FIG. 2B is a cross-sectional view of a p-type electrode according to another embodiment of the present invention, in which an intermediate layer 43 is interposed between the first electrode layer 41 and the second electrode layer 42.

Referring to FIG. 2B, the intermediate layer 43 is interposed between the first and second electrode layers 41 and 42. The intermediate layer 42 is formed of at least one selected from the group consisting of Co, Pd, Pt, Ru, Rh, Ir, Ta, Cr, Mn, Mo, Tc, W, Re, Fe, Sc, Ti, Sn, Ge, and Sb.

In the p-type electrodes 4 and 20 of the III-V group GaN-based compound semiconductor, which are shown in FIGS. 2A and 2B, the amount of the solute contained in the Zn-based material constituting the first electrode layer 41 may be in the range of about 0.1 to 49.9 atomic %. Also, each of the first electrode layer 41, the second electrode layer 42, and the intermediate layer 43 may have a thickness of about 0.1 to 100 nm.

An ohmic characteristic of the p-type electrode 4 or 20 of the LED or LD, which is formed of a transparent Zn-based material, will now be described in detail.

Figure 3:
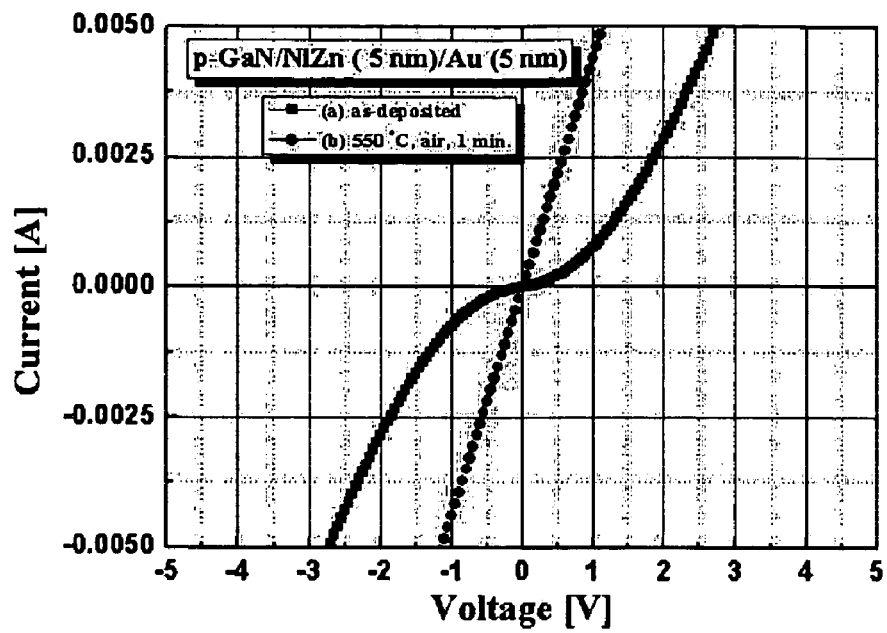
FIG. 3 shows measurement results of electrical characteristics of a p-type electrode that is obtained by depositing a Ni—Zn alloy or solid solution/Au on a p-type GaN semiconductor substrate having a carrier concentration of about $4\text{-}5 \times 10^{17}/cm^3$ and annealing the resultant structure in an air atmosphere, wherein (a) refers to a nonlinear current-voltage (I-V) characteristic as deposited, and (b) refers to a linear I-V characteristic as annealed in the air atmosphere at a temperature of about 550° C. for a minute after deposition.

FIG. 3 shows measurement results of electrical characteristics of a p-type electrode that is obtained by depositing a Ni—Zn alloy or solid solution/Au on a p-type GaN semiconductor substrate having a carrier concentration of about $4\text{-}5\times10^{17}/cm^3$ and annealing the resultant structure in an air atmosphere. (a) refers to a nonlinear current-voltage (I-V) characteristic as deposited, which revealed rectifying behavior, while (b) refers to a linear I-V characteristic as annealed in the air atmosphere at a temperature of about 550° C. for a minute after deposition, which revealed ohmic contact and resulted in a specific contact resistance of about $10^{-6}$ $\Omega cm^2$.

Figure 4:
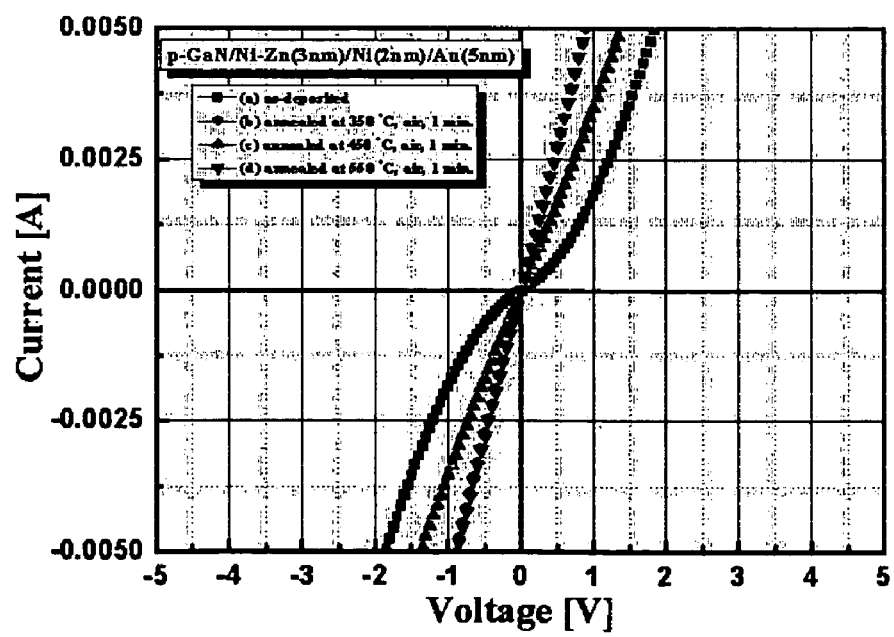
FIG. 4 shows measurement results of electrical characteristics of a p-type electrode that is obtained by depositing a Ni—Zn alloy or solid solution/Ni/Au on a p-type GaN semiconductor substrate having a carrier concentration of about $4\text{-}5 \times 10^{17}/cm^3$ and annealing the resultant structure in an air atmosphere, wherein (a) refers to a nonlinear I-V characteristic as deposited, and (b), (c), and (d) refer to linear I-V characteristics as annealed in the air atmosphere for a minute at a temperature of about 350, 450, 550° C., respectively.

FIG. 4 shows measurement results of electrical characteristics of a p-type electrode that is obtained by depositing a Ni—Zn alloy or solid solution/Ni/Au on a p-type GaN semiconductor substrate having a carrier concentration of about $4\text{-}5\times10^{17}/cm^3$ and annealing the resultant structure in an air atmosphere at a temperature of about 350 to 550° C. (a) refers to a nonlinear I-V characteristic as deposited, which revealed rectifying behavior, while (b), (c), and (d) refer to linear I-V characteristics as annealed, each of which revealed ohmic contact and resulted in a specific contact resistance of about $10^{-5}\text{-}10^{-6}$ $\Omega cm^2$.

Figure 5:
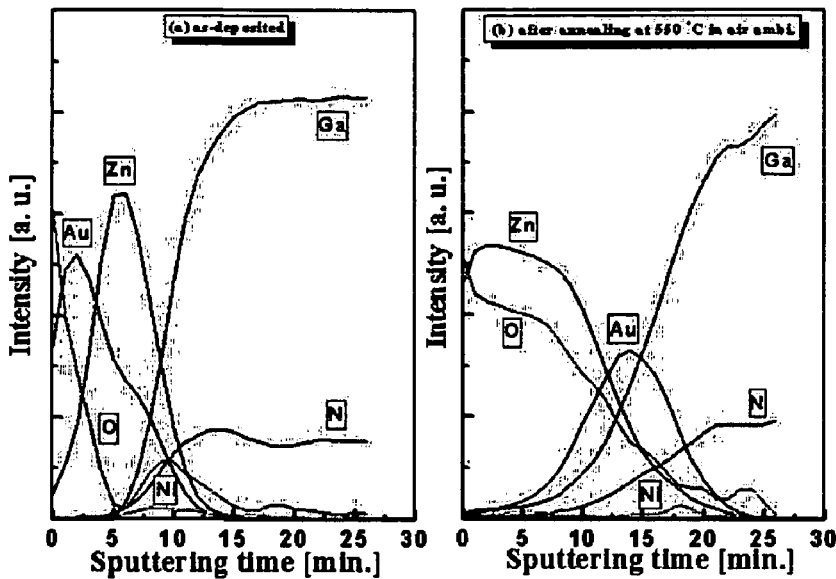
FIG. 5 shows results of x-ray photoelectron spectrometry (XPS) depth profiles obtained when a Ni—Zn alloy or solid solution/Au is deposited on a p-type GaN substrate and when the resultant structure is annealed in an air atmosphere, respectively, wherein (a) refers to the results as deposited, and (b) refers to the results as annealed.

FIG. 5 shows results of x-ray photoelectron spectrometry (XPS) depth profiles obtained when a Ni—Zn alloy or solid solution/Au is deposited on a p-type GaN substrate and when the resultant structure is annealed in an air atmosphere, respectively. As can be seen from (b), when annealing in the air atmosphere, oxygen is supplied to a p-type electrode to cause phase change, i.e., to change Zn to ZnO and Ni to NiO, respectively. Also, since NiO and Au are diffused into the p-type electrode and directly contact a p-type semiconductor layer, a high-quality ohmic contact is formed.

Figure 6:
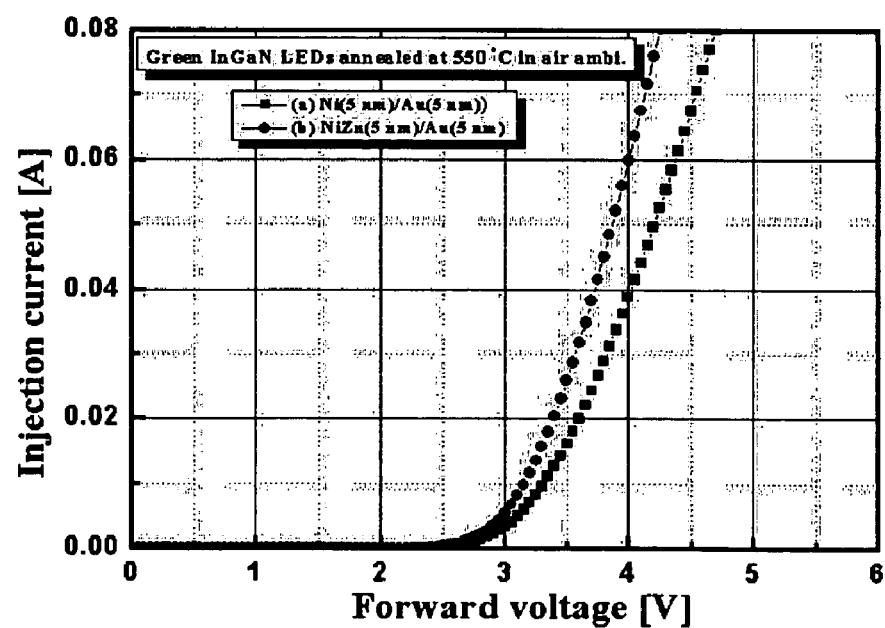
FIG. 6 shows measurement results of I-V characteristics of p-type electrodes for a green InGaN LED, which are obtained by depositing a conventional Ni/Au and a Zn—Ni alloy or solid solution/Au as and annealing the resultant structures in an air atmosphere, respectively, wherein (a) refers to the results of the Ni/Au structure, and (b) refers to the results of the Zn—Ni alloy or solid solution/Au structure.

FIG. 6 shows measurement results of I-V characteristics of p-type electrodes for a green InGaN LED, which are obtained by depositing a Ni/Au and a Zn—Ni alloy or solid solution/Au and annealing the resultant structures in an air atmosphere, respectively. The Ni/Au layer and the Zn—Ni alloy or solid solution/Au layer have a driving voltage of about 3.65 V and 3.34 V, respectively, at a current of 20 mA.

Figure 7:
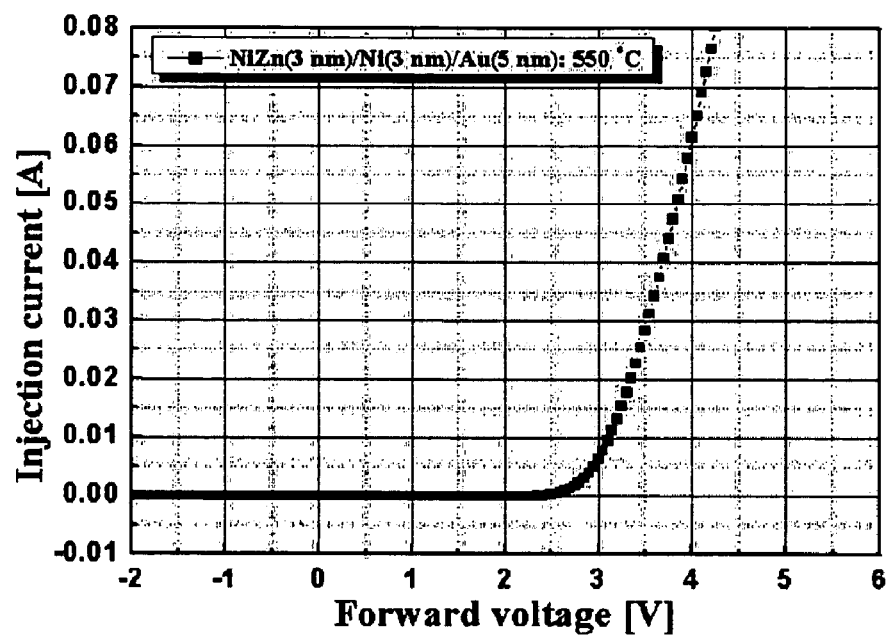
FIG. 7 shows measurement results of I-V characteristics of a p-type electrode for a green InGaN LED, which is obtained by depositing a Zn—Ni alloy or solid solution/Ni/Au and annealing the resultant structure in an air atmosphere.

FIG. 7 shows measurement results of I-V characteristics of a p-type electrode for a green InGaN LED, which is obtained by depositing a Zn—Ni alloy or solid solution/Ni/Au and annealing the resultant structure in an air atmosphere. As obtained in other ohmic contact metal systems using a Zn-based alloy or solid solution, the Zn—Ni alloy or solid solution/Ni/Au layer has a good driving voltage of about 3.4 V at a current of 20 mA.

Figure 8:
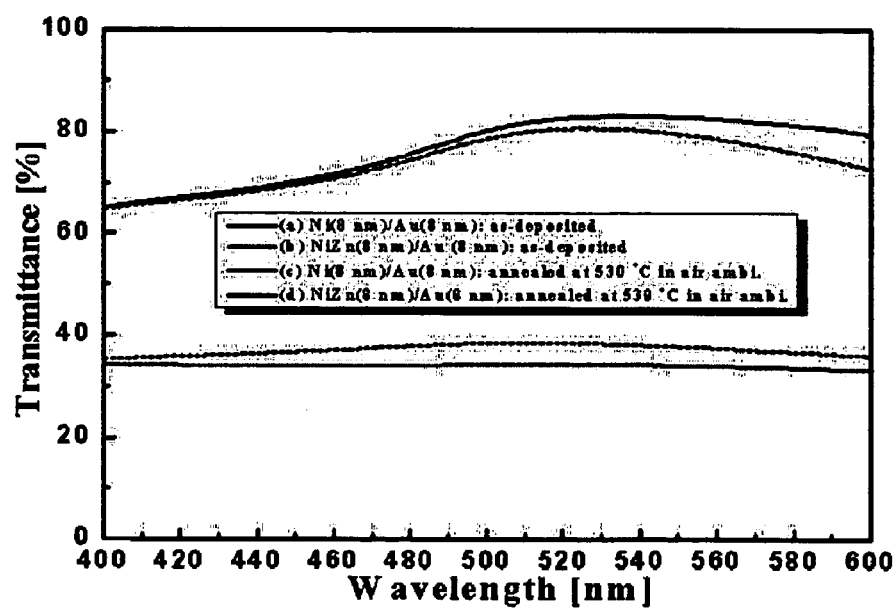
FIG. 8 shows measurement results of optical transmittance of p-type electrodes that are obtained by depositing a conventional Ni/Au layer and a Zn—Ni alloy or solid solution/Au on quartz for high temperature and annealing the resultant structures, respectively.

FIG. 8 shows measurement results of optical transmittance of p-type electrode that are obtained by depositing a conventional Ni/Au layer and a Zn—Ni alloy or solid solution/Au layer on quartz for high temperature and annealing the resultant structures. As can be seen from the results, an ohmic system formed of the Zn-based alloy or solid solution has as high an optical transmittance as that of the Ni/Au layer.

Figure 9:
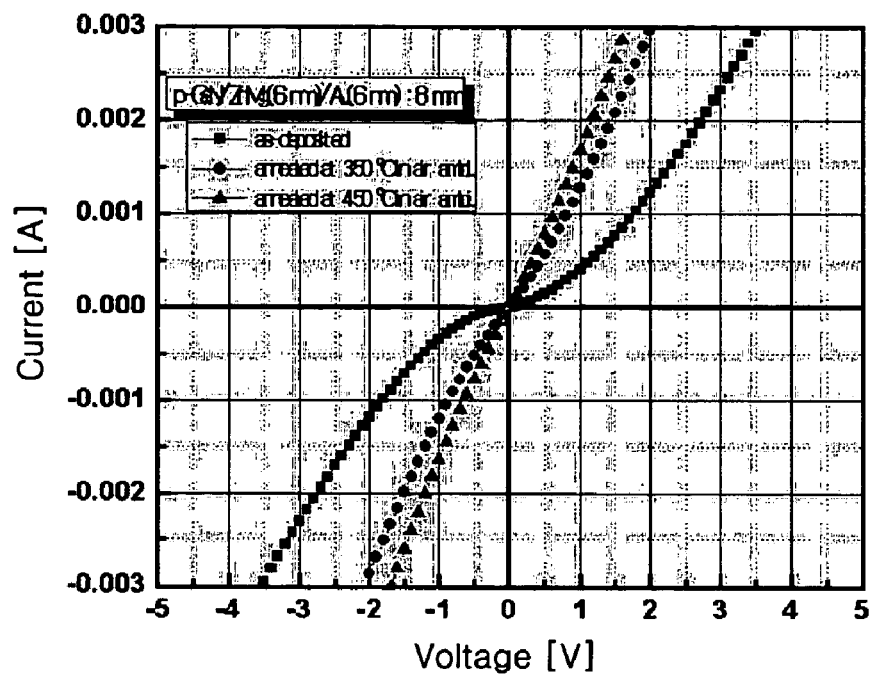
FIG. 9 shows measurement results of electrical characteristics of a p-type electrode that is obtained by depositing a Zn—Mg alloy or solid solution/Au layer on a p-type semiconductor substrate having a carrier concentration of about $4\text{-}5 \times 10^{17}/cm^3$ and annealing the resultant structure in an air atmosphere, wherein (a) refers to a nonlinear I-V characteristic as deposited, and (b) refers to a linear I-V characteristic as annealed.

FIG. 9 shows measurement results of electrical characteristics of a p-type electrode that is obtained by depositing a Zn—Mg alloy or solid solution/Au layer on a p-type semiconductor substrate having a carrier concentration of about $4\text{-}5\times10^{17}/cm^3$ and annealing the resultant structure in an air atmosphere. (a) refers to a nonlinear I-V characteristic as deposited that revealed rectifying behavior, and (b) refers to a linear I-V characteristic as annealed that revealed ohmic contact and results in a specific contact resistance of about $10^{-5}$ $\Omega cm^2$.

Figure 10:
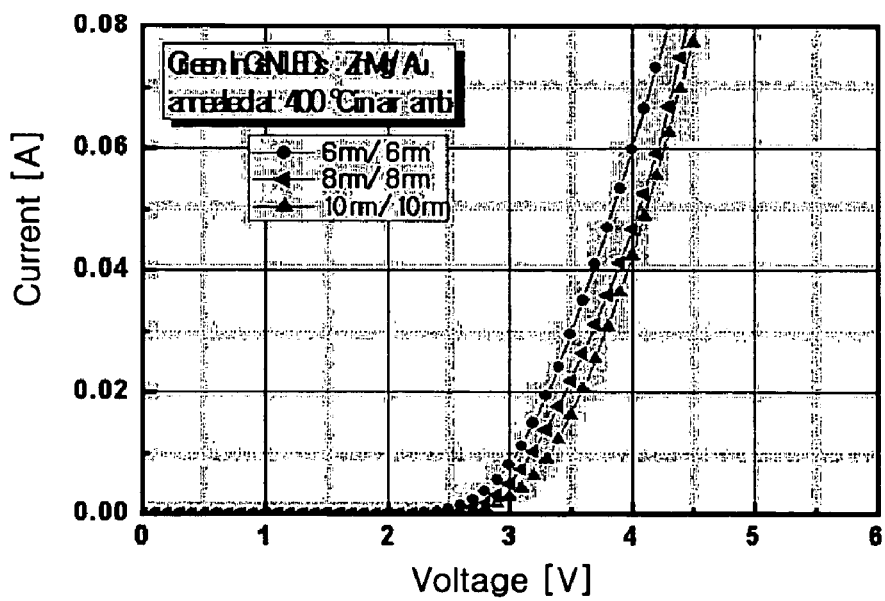
FIG. 10 shows measurement results of I-V characteristics of a p-type electrode material for a green InGaN LED, which is obtained by depositing a Zn—Mg alloy or solid solution/Au as a and annealing the resultant structure in an air atmosphere.

FIG. 10 shows measurement results of I-V characteristics of a p-type electrode material for a green InGaN LED, which is obtained by depositing a Zn—Mg alloy or solid solution/Au and annealing the resultant structure in an air atmosphere. When the Zn—Mg alloy or solid solution and the Au layer are formed to a thickness of 8 nm or less/8 nm or less, respectively, they have a good driving voltage of about 3.5 V or less at a current of 20 mA.

Hereinafter, a method of manufacturing a p-type electrode according to embodiments of the present invention will be described.

EMBODIMENT 1

In operation 1, at the outset, the surface of a sample, in which a GaN-based semiconductor crystalline layer including a p-type semiconductor layer is formed on a substrate, is washed in an ultrasonic bath at a temperature of 60° C. using trichloroethylene (TCE), acetone, methanol, and distilled water, respectively, for 5 minutes each time. Then, the resultant structure is hard baked at a temperature of 100° C. for 10 minutes to remove the remaining moisture from this sample.

In operation 2, a photoresist layer is spin-coated on the p-type compound semiconductor layer at 4,500 RPM, and the resultant structure is soft baked at a temperature of 85° C. for 15 minutes.

In operation 3, to develop a mask pattern, the sample is aligned with a mask, exposed to ultraviolet rays (UV) of 22.8 mW, and dipped in a solution containing a mixture of a developing solution with distilled water in a ratio of 1:4 for 25 seconds.

In operation 4, the developed sample is dipped in a buffered oxide etchant (BOE) solution for 5 minutes to remove the remaining contaminants from the sample.

In operation 5, a Zn-based electrode material (5 nm)/Au (5 nm) according to the present invention is deposited on the entire surface of the resultant structure using an electron-beam (e-beam) evaporator, and lift-off is carried out using acetone to pattern an electrode.

In operation 6, the sample is loaded into a rapid thermal annealing (RTA) furnace and annealed in an air atmosphere at a temperature of about 550° C. for 1 minute. As a result, a transparent electrode using formation of ohmic contact is formed on the surface of the p-type semiconductor layer disposed on the substrate.

EMBODIMENT 2

In operation 1', operations 1 through 4 of the first embodiment are performed in the same manner.

In operation 2', a Zn—Ni alloy (10 nm)/Au (10 nm) according to the present invention is deposited on the entire surface of the resultant structure using an e-beam evaporator, and lift-off is carried out using acetone to pattern an electrode.

In operation 3', the sample is loaded into an RTA furnace and annealed in an air atmosphere at a temperature of about 350 to 550° C. for 1 minute. As a result, a transparent electrode is formed on the surface of the p-type semiconductor layer disposed on the substrate.

EMBODIMENT 3

In operation 1", operations 1 through 4 of the first embodiment are performed in the same manner.

In operation 2", a Zn—Ni alloy (3 nm)/Ni (2 nm)/Au (5 nm) according to the present invention is deposited on the entire surface of the resultant structure using an e-beam evaporator, and lift-off is carried out using acetone to pattern an electrode.

In operation 3", the sample is loaded into an RTA furnace and annealed in an air atmosphere at a temperature of about 350 to 550° C. for 1 minute. As a result, a transparent electrode is formed on the surface of the p-type semiconductor layer disposed on the substrate.

As described above, the present invention provides an ohmic electrode forming process, which is one of the most important techniques that enhance commercial availability of LEDs and LDs using p-type GaN-based semiconductor. Thus, GaN-based semiconductor becomes highly commercially available. Also, since the surface of an electrode is in a very good condition during formation of ohmic contact, it is expected to improve wire bonding during device packaging, thus increasing yield. Further, electrical loss is reduced due to excellent electrical characteristics, such as a low specific contact resistance and good I-V characteristics, so that optical effects can also improve. Thus, GaN-based semiconductor can contribute to developments in LEDs and LDs. In particular, it is assumed that the second embodiment can be used to embody a high-quality flip-chip LED, of which luminous efficiency is even higher than that of a conventional top-emitting LED.

An ohmic contact characteristic is regarded as one of fundamental problems that are incurred in a continuous wave mode of LEDs and LDs formed of p-type GaN-based semiconductor and greatly affects electrical, optical, and thermal properties of the LEDs and LDs. In consideration of the foregoing, the present invention utilizes a Zn-based alloy or solid solution, which is not yet proposed among reported p-type ohmic contact models, and provides a high-quality ohmic contact metal system, which has better electrical characteristics than conventional cases and as high an optical transmittance as a typical Ni/Au structure.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electrode for a III-V group GaN-based compound semiconductor device, the electrode comprising:
a first layer disposed on a III-V group nitride compound semiconductor layer and formed of a Zn-based material containing a solute, wherein an amount of the solute contained in the Zn-based material is in the range of about 0.1 to 49.9 atomic %;
a second layer stacked on the first layer and formed of at least one selected from the group consisting of Co, Ir, Ta, Cr, Mn, Mo, Tc, W, Re, Fe, Sc, Sn, Ge, Sb, Al, ITO, ZITO, ZIO, GIO, ZTO, FTO, AZO, GZO, $In_4Sn_3O_{12}$, and $Zn_{1-x}Mg_xO$ ($0 \leq x \leq 1$); and
an intermediate layer interposed between the first layer and the second layer, the intermediate layer being formed of at least one selected from the group consisting of Co, Pd, Pt, Ru, Rh, Ir, Ta, Cr, Mn, Mo, Tc, W, Re, Fe, Sc, Ti, Sn, Ge, and Sb, wherein the intermediate layer is in contact with the first layer and the second layer.

2. The electrode of claim 1, wherein the Zn-based material constituting the first layer is one of an alloy and a solid solution.

3. The electrode of claim 1, wherein the Zn-based material contains at least a solute selected from the group consisting of Ni, Mg, Co, Pd, Pt, Ru, Rh, Ir, Ta, Cr, Mn, Mo, Tc, W, Re, Fe, Sc, Ti, Sn, Ge, Sb, and Ag.

4. The electrode of claim 1, wherein each of the first layer and the second layer has a thickness of about 0.1 to 100 nm.

5. The electrode of claim 2, wherein each of the first layer, the second layer, and the intermediate layer has a thickness of about 0.1 to 100 nm.

6. The electrode of claim 3, wherein each of the first layer, the second layer, and the intermediate layer has a thickness of about 0.1 to 100 nm.

7. The electrode of claim 1, wherein the III-V group nitride compound semiconductor layer is formed of one of GaN and $Al_xIn_yGa_zN$ ($0<x+y+z<1$).

8. The electrode of claim 1, wherein each of the first layer and the second layer is annealed in an atmosphere containing at least $O_2$.

9. The electrode of claim 1, wherein at least a majority of the surface area of the first layer is in contact with at least a majority of the surface area of the III-V group nitride compound semiconductor layer.

10. A III-V group GaN-based compound semiconductor device comprising:
    a GaN-based compound semiconductor layer formed by stacking a plurality of layers and including an active layer for emission;
    a p-type semiconductor layer disposed on the GaN-based compound semiconductor layer; and
    a p-type electrode layer disposed on the p-type semiconductor layer,
    wherein the p-type electrode layer comprises:
        a first layer disposed on the p-type semiconductor layer and formed of a Zn-based material containing a solute, wherein an amount of the solute contained in the Zn-based material is in the range of about 0.1 to 49.9 atomic %;
        a second layer stacked on the first layer and formed of at least one selected from the group consisting of Co, Ir, Ta, Cr, Mn, Mo, Tc, W, Re, Fe, Sc, Sn, Ge, Sb, Al, ITO, ZITO, ZIO, GIO, ZTO, FTO, AZO, GZO, $In_4Sn_3O_{12}$, and $Zn_{1-x}Mg_xO$ ($0 \leq x \leq 1$); and
        an intermediate layer interposed between the first layer and the second layer, the intermediate layer being formed of at least one selected from the group consisting of Co, Pd, Pt, Ru, Rh, Ir, Ta, Cr, Mn, Mo, Tc, W, Re, Fe, Sc, Ti, Sn, Ge, and Sb, wherein at least a majority of the surface area of the first layer is in contact with at least a majority of the surface area of the III-V group nitride compound semiconductor layer.

11. The device of claim 10, wherein the Zn-based material constituting the first layer is one of an alloy and a solid solution.

12. The device of claim 10, wherein the Zn-based material contains at least a solute selected from the group consisting of Ni, Mg, Co, Pd, Pt, Ru, Rh, Ir, Ta, Cr, Mn, Mo, Tc, W, Re, Fe, Sc, Ti, Sn, Ge, Sb, and Ag.

13. The device of claim 10, wherein each of the first layer and the second layer has a thickness of about 0.1 to 100 nm.

14. The device of claim 11, wherein each of the first layer, the second layer, and the intermediate layer has a thickness of about 0.1 to 100 nm.

15. The device of claim 12, wherein each of the first layer, the second layer, and the intermediate layer has a thickness of about 0.1 to 100 nm.

16. The device of claim 10, wherein at least part of the GaN-based compound semiconductor layer is formed of one of GaN and $Al_xIn_yGa_zN$ ($0<x+y+z<1$).

17. The device of claim 10, wherein the p-type electrode layer is annealed in an atmosphere containing at least $O_2$.

18. The device of claim 10, wherein the first layer is disposed on a III-V group nitride compound semiconductor layer, wherein the second layer is stacked on the first layer and formed of at least one selected from the group consisting of Co, Ir, Ta, Cr, Mn, Mo, Tc, W, Re, Fe, Sc, Sn, Ge, Sb, ITO, ZITO, ZIO, GIO, ZTO, FTO, AZO, GZO, $In_4Sn_3O_{12}$, and $Zn_{1-x}Mg_xO$ ($0 \leq x \leq 1$), and wherein the intermediate layer is interposed between the first layer and the second layer, the intermediate layer being formed of at least one selected from the group consisting of Co, Pd, Pt, Ru, Rh, Ir, Ta, Cr, Mn, Tc, W, Re, Fe, Sc, Ti, Sn, Ge, and Sb.

19. An electrode for a III-V group GaN-based compound semiconductor device, the electrode comprising:
    a first layer disposed on a III-V group nitride compound semiconductor layer and formed of a Zn-based material containing a solute, wherein an amount of the solute contained in the Zn-based material is in the range of about 0.1 to 49.9 atomic %;
    a second layer stacked on the first layer and formed of at least one selected from the group consisting of Co, Ir, Ta, Cr, Mn, Mo, Tc, W, Re, Fe, Sc, Sn, Ge, Sb, ITO, ZITO, ZIO, GIO, ZTO, FTO, AZO, GZO, $In_4Sn_3O_{12}$, and $Zn_{1-x}Mg_xO$ ($0 \leq x \leq 1$); and
    an intermediate layer interposed between the first layer and the second layer, the intermediate layer being formed of at least one selected from the group consisting of Co, Pd, Pt, Ru, Rh, Ir, Ta, Cr, Mn, Tc, W, Re, Fe, Sc, Ti, Sn, Ge, and Sb.

20. The electrode of claim 19, wherein the intermediate layer is in contact with the first layer and the second layer.

21. The electrode of claim 20, wherein at least a majority of the surface area of the first layer is in contact with at least a majority of the surface area of the III-V group nitride compound semiconductor layer.

22. The electrode of claim 19, wherein at least a majority of the surface area of the first layer is in contact with at least a majority of the surface area of the III-V group nitride compound semiconductor layer.

* * * * *